US006689624B2

(12) United States Patent
Doan et al.

(10) Patent No.: US 6,689,624 B2
(45) Date of Patent: Feb. 10, 2004

(54) METHOD OF FORMING SELF-ALIGNED, TRENCHLESS MANGETORESITIVE RANDOM-ACCESS MEMORY (MRAM) STRUCTURE WITH SIDEWALL CONTAINMENT OF MRAM STRUCTURE

(75) Inventors: Trung T. Doan, Boise, ID (US); Roger Lee, Boise, ID (US); Dennis Keller, Boise, ID (US); Gurtej Sandhu, Boise, ID (US); Ren Earl, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/408,450

(22) Filed: Apr. 8, 2003

(65) Prior Publication Data

US 2003/0207471 A1 Nov. 6, 2003

Related U.S. Application Data

(62) Division of application No. 09/805,916, filed on Mar. 15, 2001.

(51) Int. Cl.$^7$ ................................................ H01L 21/00
(52) U.S. Cl. ............................................................ 438/3
(58) Field of Search .......................... 438/3, 595–596, 438/691, 800

(56) References Cited

U.S. PATENT DOCUMENTS

| | | |
|---|---|---|
| 5,804,458 A | 9/1998 | Tehrani et al. |
| 5,841,692 A | 11/1998 | Gallagher et al. |
| 5,940,319 A | 8/1999 | Durlam et al. |
| 5,956,267 A | 9/1999 | Hurst et al. |
| 6,165,803 A | 12/2000 | Chen et al. |

FOREIGN PATENT DOCUMENTS

JP     2000285668 A     10/2000

OTHER PUBLICATIONS

Slaughter et al. "Magnetic Tunnel Junciton Materials for Electronic Applications" JOM–2, 52(6) (2000) Jun. 2000. <<http://www.tms.org/pubs/journals/JOM/0006/Slaughter/Slaughter–0006.html>>.*

* cited by examiner

*Primary Examiner*—Craig A. Thompson
(74) *Attorney, Agent, or Firm*—Dickstein Shapiro Morin & Oshinsky (57) ABSTRACT

This invention pertains to a method of fabricating a trenchless MRAM structure and to the resultant MRAM structure. The MRAM structure of the invention has a pinned layer formed within protective sidewalls formed over a substrate. The protective sidewalls facilitate formation of the MRAM structure by a self-aligning process.

45 Claims, 9 Drawing Sheets

METHOD OF FORMING SELF-ALIGNED, TRENCHLESS MANGETORESITIVE RANDOM-ACCESS MEMORY (MRAM) STRUCTURE WITH SIDEWALL CONTAINMENT OF MRAM STRUCTURE

This application is a divisional of U.S. patent application Ser. No. 09/805,916 entitled SELF-ALIGNED, TRENCHLESS MAGNETORESISTIVE RANDOM ACCESS MEMORY (MRAM) STRUCTURE WITH SIDEWALL CONTAINMENT OF MRAM STRUCTURE, filed Mar. 15, 2001. The entirety of this application is incorporated herein by reference.

FIELD OF THE INVENTION

This invention generally relates to a method of fabricating an MRAM structure, and more particularly to an MRAM structure that has a pinned layer formed above an insulating layer and within a protective sidewall.

BACKGROUND OF THE INVENTION

Integrated circuit designers have always sought the ideal semiconductor memory: a device that is randomly accessible, can be written or read very quickly, is non-volatile, but indefinitely alterable, and consumes little power. Magnetoresistive random access memory (MRAM) technology has been increasingly viewed as offering all these advantages.

A magnetic memory element has a structure which includes magnetic layers separated by a non-magnetic layer. Information can be read as a "1" or a "0" as directions of magnetization vectors in these magnetic layers. Magnetic vectors in one magnetic layer are magnetically fixed or pinned, while the magnetic vectors of the other magnetic layer are not fixed so that the magnetization direction is free to switch between "parallel" and "antiparallel" states relative to the pinned layer. In response to parallel and antiparallel states, the magnetic memory clement represents two different resistance states, which are read by the memory circuit as either a "1" or a "0". It is the detection of these resistance states for the different magnetic orientations that allows the MRAM to read and write information.

In standard MRAM processing, there are certain sensitivities related to the use of optical photolithography. Typically, the free magnetic layer is patterned separately from a previously deposited copper interconnect line and the pinned magnetic layer, which rests over it. This separate patterning requires a photo-step, in which registration is critical for placement of the free layer over the pinned layer.

Spin etching is typically used to form the pinned layer. Spin etching causes the pinned layer to be "dished" or recessed in the center to a greater degree than the more exterior regions. This recessed shape is desirable because it is thought to cause more of the electromagnetic field to be directed at the free magnetic layer, thereby reducing the current needed to change the state of the free layer. Spin etching is notoriously non-uniform as it relates to the variations between the center and the outer regions of the wafer. Additionally, there are problems wit h lopsidedness at the trailing edge of the spin caused by this process.

It would be desirable to have a method of fabricating the MRAM structure whereby the structure is formed in a more accurate and reliable way. Sidewall protection of the MRAM structure, prevention of copper migration, and accurate definition of the structure are all characteristics desired to be improved. Additionally, processing of the MRAM structure without need for spin etching so as to achieve a more uniform structure across the wafer would also be advantageous.

SUMMARY OF THE INVENTION

This invention provides a method of fabricating an MRAM structure. The MRAM structure of the invention does not have the pinned layer recessed within a trench, but instead forms it above an insulating layer. The method provides a sidewall protection for the bottom magnetic layer of the MRAM structure and insures a more reliable structure, which also allows definition of the MRAM stack by a self-aligning process. By this self-aligned process, the bottom portion of the MRAM stack, incorporating the bottom magnetic layer, is defined in a single etching step and the top portion, incorporating the top magnetic layer, is defined above the bottom magnetic layer in another single, self-aligned etching step, which positions the top magnetic layer over the bottom magnetic layer.

This process allows for the fabrication of MRAM structures without employing trench process technology. It eliminates many of the sensitivities associated with optical photolithography as well as the process variabilities associated with spin etching of the recess region for the pinned layer. Finally, it allows for accurate control of the top magnetic layer in its positioning over the bottom magnetic layer so as to improve the electrical characteristics of the MRAM.

These and other features and advantages of the invention will be more clearly understood from the following detailed description of the invention which is provided in connection with the accompanying drawings.

DETAILED DESCRIPTION OF THE PREFERRED EMBODIMENTS

In the following detailed description, reference is made to various specific embodiments in which the invention may be practiced. These embodiments are described with sufficient detail to enable those skilled in the art to practice the invention, and it is to be understood that other embodiments may be employed, and that structural and electrical changes may be made without departing from the spirit or scope of the present invention.

The terms "substrate" and "wafer" are used interchangeably in the following description and may include any semiconductor-based structure. The structure should be understood to include silicon, silicon-on insulator (SOI), silicon-on-sapphire (SOS), doped and undoped semiconductors, epitaxial layers of silicon supported by a base semiconductor foundation, and other semiconductor structures. The semiconductor need not be silicon-based. The semiconductor could be silicon-germanium, germanium, or gallium arsenide. When reference is made to the substrate in the following description, previous process steps may have been utilized to form regions or junctions in or over the base semiconductor or foundation.

The term "metal" is intended to include not only elemental metal, but metal with other trace metals or in various alloyed combinations with other metals as known in the semiconductor art, as long as such alloy retains the physical and chemical properties of the metal. The term "metal" is also intended to include conductive oxides of such metals.

No particular order is required for the method steps described below, with the exception of those logically requiring the results of prior steps. Accordingly, while many of the steps discussed below are discussed as being performed in an exemplary order, this order may be altered.

The invention provides a method of forming an MRAM structure that does not require the pinned layer, that is, the bottom magnetic (M1) layer, to be recessed within a trench. Additionally, this method results in a protective sidewall for the MRAM structure. Such a protective sidewall adds increased reliability by preventing the migration of copper out of the M1 interconnect line, that is, the digit line, and also allows the MRAM stack to be accurately defined during processing. Further, by using the process of the invention, many of the sensitivities associated with optical photolithography are eliminated, as are the processing variabilities associated with spin etching of a recess region for the pinned layer. Finally, the method of the invention allows for accurate control of the top magnetic layer (M2) size and positioning over the M1 layer so as to improve the electrical characteristics of the MRAM structure.

Figure 1:
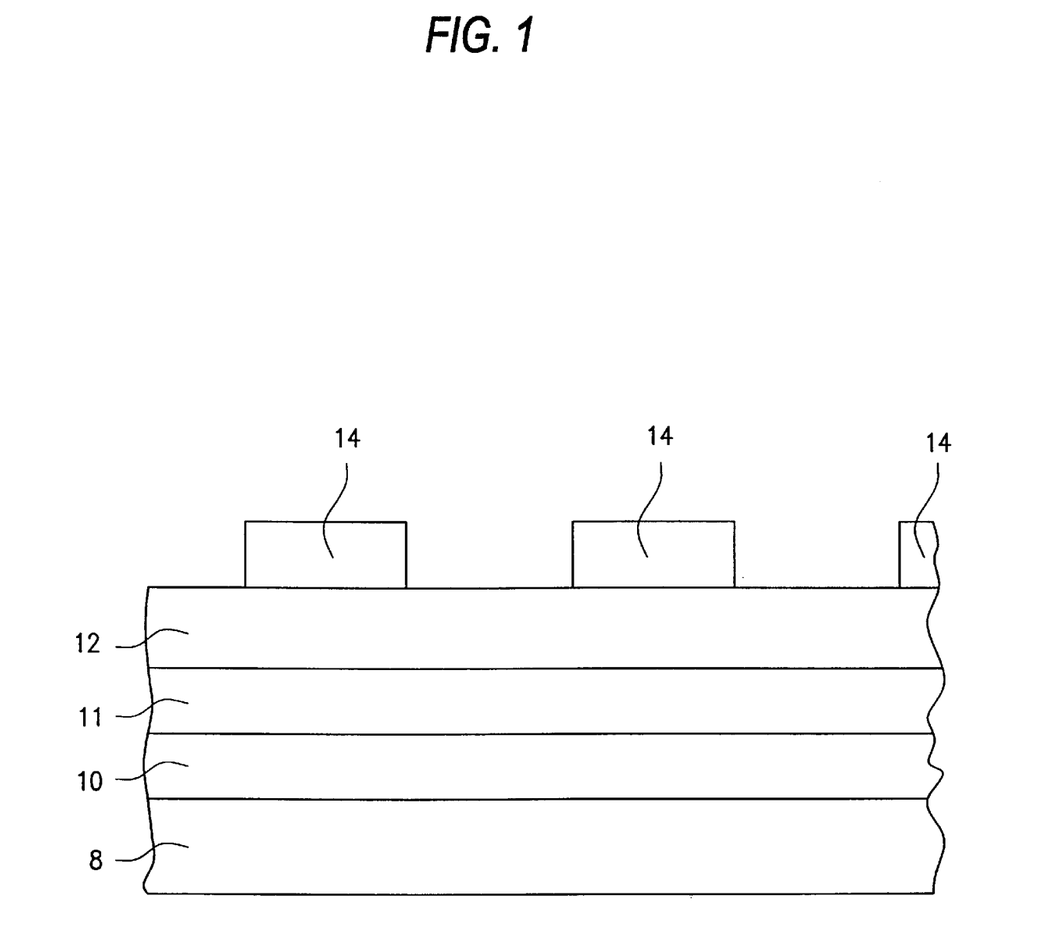
FIG. 1 is an illustration of an intermediate stage of processing of the MRAM device according to the invention.

Referring now to the drawings, where like elements are designated by like reference numerals, FIG. 1 depicts a cross-section of an MRAM memory cell during processing at an intermediate stage wherein a semiconductor layer 8, a layer 10 having CMOS access and logic transistors over the semiconductor layer 8, and layer of insulating material 11, preferably TEOS or CVD nitride, are provided. The insulating layer 11 should be about 5000 Angstroms thick. CMOS access transistors (not shown) can be fabricated over the semiconductor layer 8 and within layer 10 in the regions around and under the periphery of the MRAM array to control the functioning (reading and writing) of the MRAM devices to be fabricated by the process of this invention. Other transistors, such as logic or decoder transistors are fabricated in this same layer 10 but under the MRAM array. Such a configuration of the MRAM transistors conserves valuable space on the wafer. All MRAM fabrication steps discussed hereafter occur over the layer 10 within which the CMOS transistor structures are formed and the planar insulating layer 11 surface formed over theses structures. Layers 8, 10, and 11 can be considered to be a substrate for further processing steps.

An oxide layer 12 is formed over the insulating layer 11. This may be accomplished as known in the art by any convenient means, such as by chemical vapor deposition (CVD). This oxide layer 12 is patterned with photoresist mask 14 to prevent the etching of regions that will not be removed until later processing steps. The protected oxide layer 12 regions will serve as separators for the MRAM stacks 32 during the first stage of fabrication.

Figure 2:
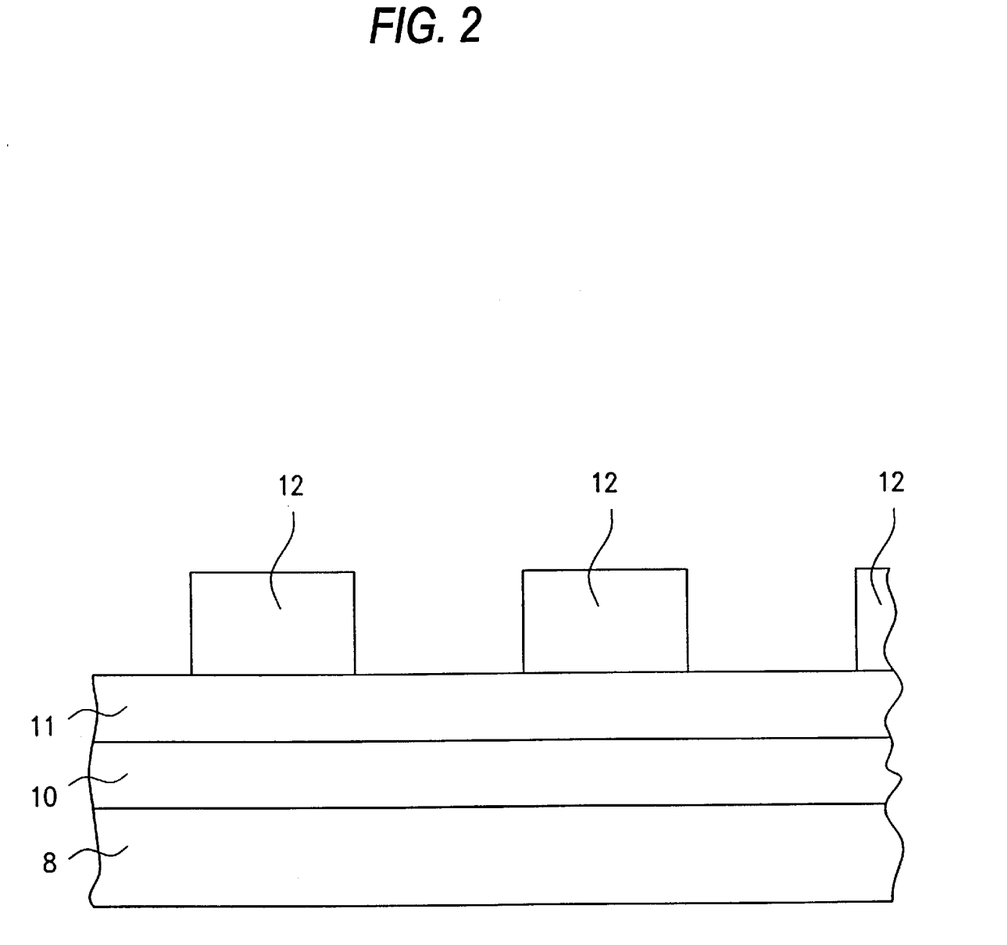
FIG. 2 is an illustration of a stage of processing of the MRAM device according to the invention, subsequent to the stage illustrated in FIG. 1.

Referring now to FIG. 2, portions of the oxide layer 12 are removed using photoresist mask 14 to expose the underlying insulating layer 11. This may be accomplished in multiple ways after the photoresist mask 14 is developed over those portions not to be removed. A spacer oxide etch plus a facet etch can be used; a spacer etch can be used; and use of an oxide implant into an non-oxidized layer followed by a selective wet etch to remove the oxidized regions can be used as well. The photoresist 14 is also removed from over the remaining sections of the oxide layer 12. This step leaves the oxide layer 12 over portions of the substrate 10 that are between the future MRAM stacks 32 (see FIG. 7) as shown in FIG. 2. These remaining sections of the oxide layer 12 are intended to provide contours to the upper surface of the wafer.

Figure 3:
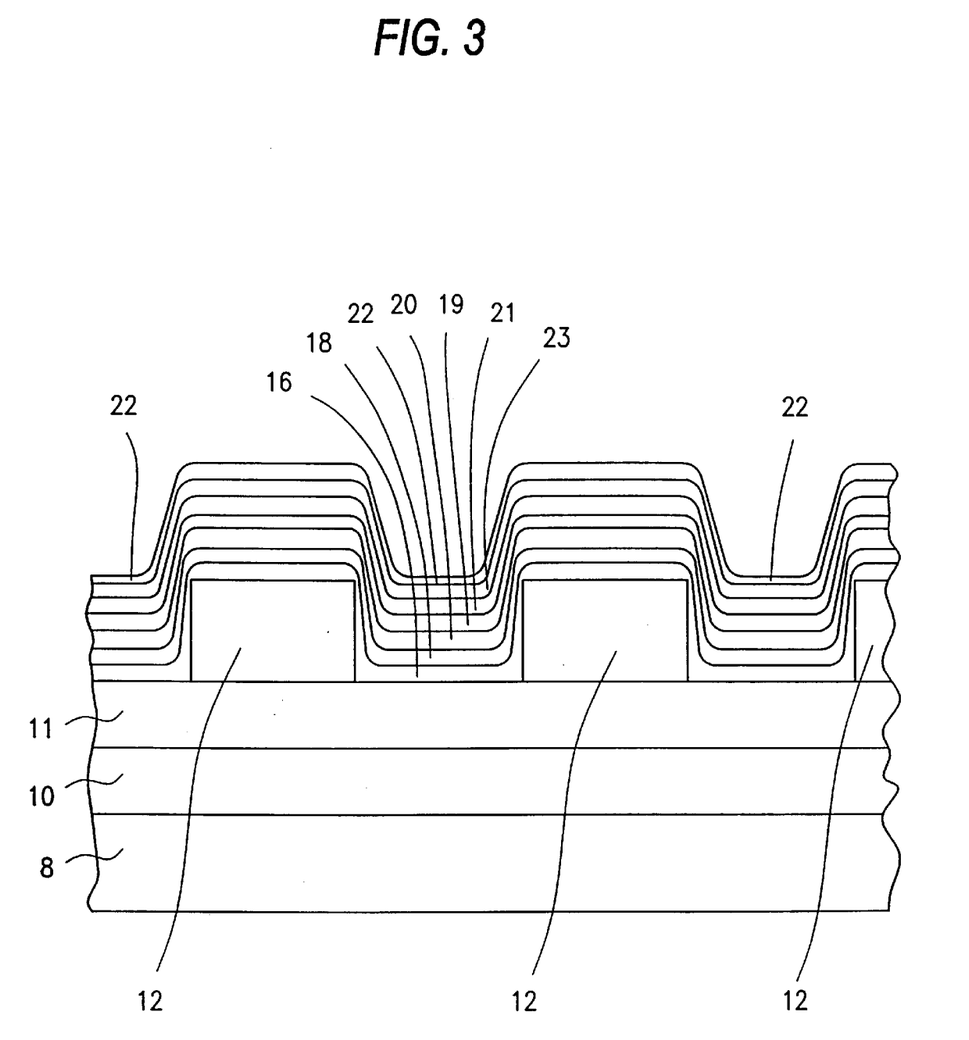
FIG. 3 is an illustration of a stage of processing of the MRAM device according to the invention, subsequent to the stage illustrated in FIG. 2.
Figure 7:
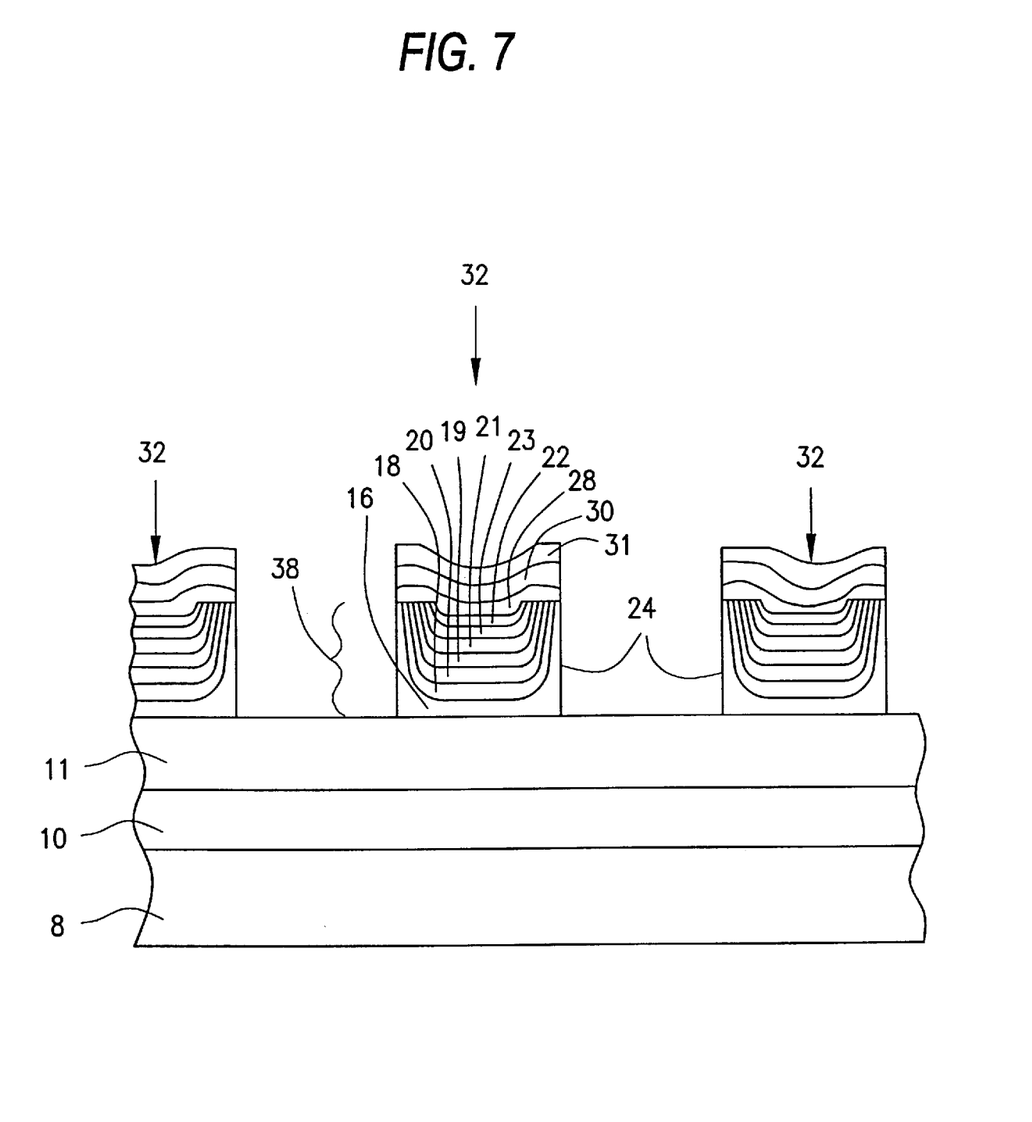
FIG. 7 is an illustration of a stage of processing of the MRAM device according to the invention, subsequent to the stage illustrated in FIG. 6.

Referring to FIG. 3, a series of layers are next deposited over the insulating layer 11 and remaining oxide layer 12 to form the bottom portion 38 (see FIG. 4) of the MRAM stack 32 (see FIG. 7). The first of these layers is an insulating nitride layer 16. The nitride layer 16 can be formed by CVD, PECVD, or ALD, and should be thick enough to be able to form sidewalls, less than 200 Å should be sufficient. Other insulating layers can be alternatively used for layer 16, such as aluminum oxide, silicon oxide, or aluminum nitride. Over this nitride layer 16 is deposited a layer of tantalum 18. The tantalum layer 18 is an adhesion, barrier, and etch stop layer, and can be sputter deposited to a thickness of about 100 Å. Next is deposited a layer of copper 20 over the tantalum layer 18. This copper layer 20 forms an interconnect line and is the current carrier between the MRAM pinned layer (M1 22) and associated CMOS circuitry in the underlying CMOS layer 10, and it can be formed by electroplating or sputtering, and should be about 2000 Å thick. This copper layer 20 interconnect can be used as the digit line, or bit line, for the MRAM device. Over the copper layer 20 is deposited another barrier layer 19 comprising tantalum. This barrier layer can be about 20–400 Å thick. This barrier layer 19 separates the copper of the digit line from the subsequently formed layers. Over these layers 16, 18, 19, 20 is next deposited a seed layer 21 for the bottom magnetic layer region. The seed layer may comprise NiFe and should be about 10–100 Å thick. This seed layer 21 enables proper crystal growth of the next deposited anti-ferromagnetic layer 23. An anti-ferromagnetic layer 23 is formed over the seed layer to enable the pinning of the bottom magnetic layer. The anti-ferromagnetic layer 23 may be FeMn and should be about 10–100 Å thick. Over this anti-ferromagnetic layer 23 is formed the first magnetic layer (M1) 22.

These layers 16, 18, 19, 20, 21, 23, 22 are deposited in a conformal manner, as shown in FIG. 3, so that at its highest point relative to the underlying substrate 10, the nitride layer 16 deposited over and on the lateral sides of the remaining portions of the oxide layer 12 is at a higher elevation than the lowest portion of the M1 layer 22, relative to the underlying substrate.

The nitride layer 16 is a protective and containment layer. It allows for part of the self-alignment of subsequent process steps because it provides a differential layer to allow a wet removal of the oxide at a later stage of processing, it acts as a stop layer for the CMP process described below; it is a containment barrier against side damage to the MRAM structure and helps prevent the migration of the copper from the copper layer 20 forming the digit lines.

The M1 layer 22 may be deposited by any convenient method, such as by sputtering or evaporation techniques, and depending on the materials used, should have a thickness of about 10–100 Å. The M1 layer 22 may be one or more layers of any of a variety of materials with good magnetic properties, such as nickel iron cobalt (NiFeCo) alloy, or any similar compounds or alloys. This first magnetic layer 22 is preferably nickel iron (NiFe). The M1 layer 22 will form the pinned magnetic layer, meaning that the magnetic orientation of the layer is fixed during the accessing of the M1 layer 22 during MRAM operation. This M1 layer 22 is pinned because of its association with the underlying anti-ferromagnetic layer 23, creating a singularly-oriented fixed magnetic field for this M1 layer 22.

Figure 4:
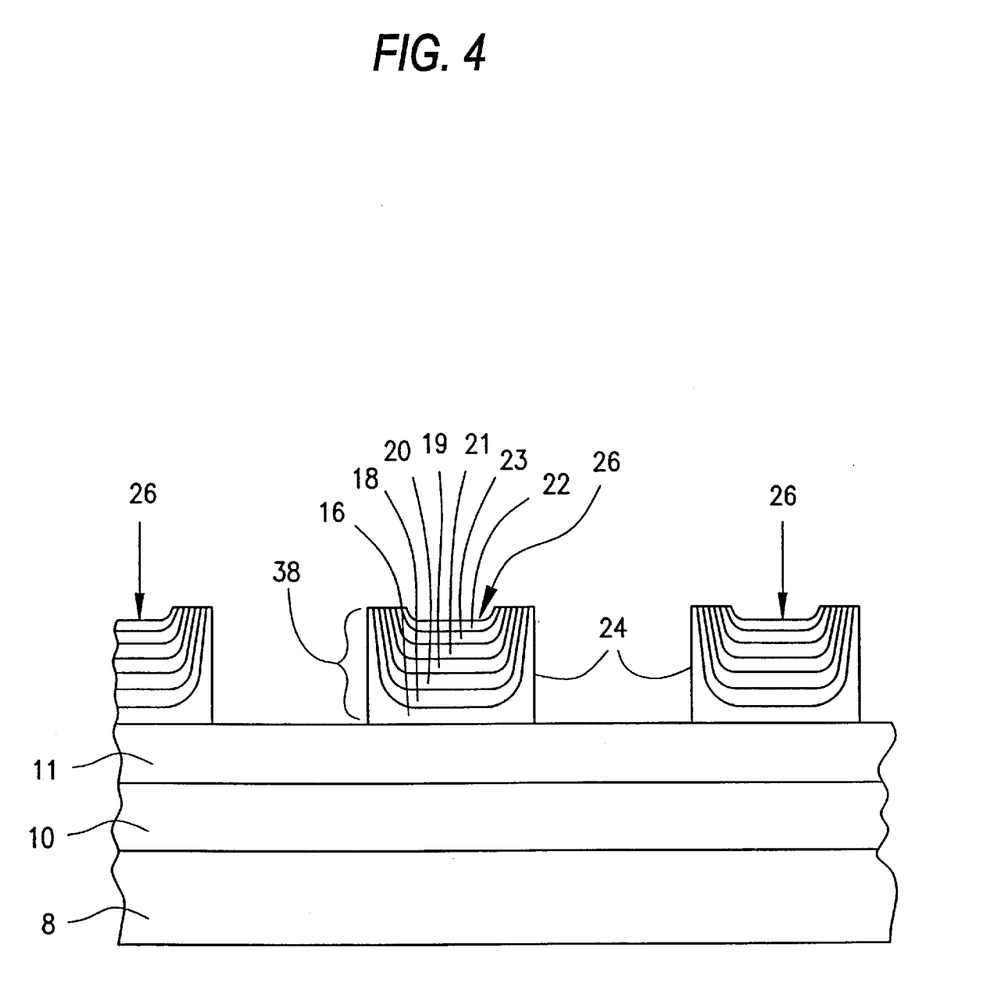
FIG. 4 is an illustration of a stage of processing of the MRAM device according to the invention, subsequent to the stage illustrated in FIG. 3.
Figure 8:
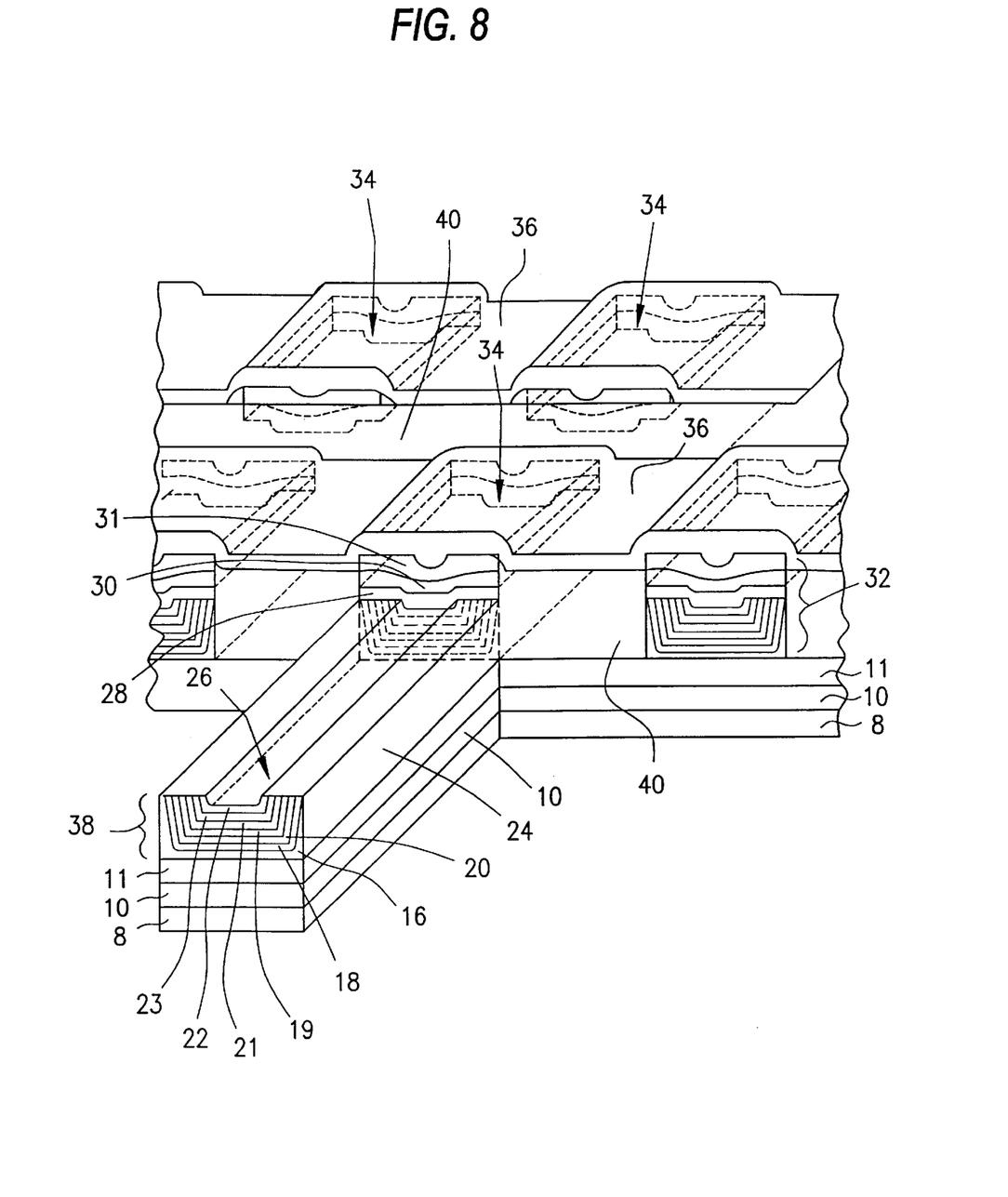
FIG. 8 is a cutaway perspective view of multiple MRAM devices illustrating the interconnect between top magnetic layer islands in relation to underlying bottom magnetic layer lines.

Referring to FIG. 4, the just deposited layers 16, 18, 19, 20, 21, 23, 22 and the underlying remaining oxide layer 12 are patterned and etched so that the regions of the layers 16, 18, 19, 20, 21, 23, 22 over the remaining oxide layer 12 and the oxide layer 12 itself are removed and the underlying insulating layer 11 is exposed. This may be accomplished by etching with HF acid. The layers 16, 18, 19, 20, 21, 23, 22 should remain over the insulating layer 11 where the oxide layer 12 was first removed, as described in relation to FIG. 2, so that the layers remain over the nitride bottom layer 16 and within the nitride sidewalls 24 created by the selective removal of the unwanted portions of the layers. The layers should next be polished by CMP (chemical mechanical polishing) using the nitride layer 16 as the stop layer to form stacks of layers for the MRAM bottom portion 38 as shown in FIG. 4. This resulting structure should be such that the bottom nitride layer 16 forms complete sidewalls 24 for the entire height of, and a remaining bottom portion of the layer 16 for the length of the bottom of the MRAM structure as shown in FIG. 4 and 8. Also, the uppermost first M1 layer 22 of the structure should incorporate a recessed region 26, as shown in FIG. 4 and 8, which is below the top of the nitride sidewalls 24. This recessed region 26 of the M1 layer 22 is a natural occurrence of the conformal deposition of the layers 16, 18, 19, 20, 21, 23, 22 and the CMP process, and as discussed above in relation to FIG. 3, was made possible because the nitride layer 16 was formed at a maximum height which was above this recessed region 26 of the M1 layer 22. Forming the recessed region 26 by this method eliminates the process variables associated with spin etching of a recess for the pinned layer as used in the prior art, and therefore, results in a more uniform structure. The nitride sidewall 24 provides structure reliability by preventing bridging between structures, which could occur in the prior art because of the reliance on anisotropic etching to accomplish device separation. The sidewall 24 also confines the copper layer 20 and prevents copper migration from the digit line into any surrounding layers. Using the nitride sidewall 24 technique is a more accurate method of defining an MRAM stack 32 because the initial oxide pattern, which contributes to the sidewall 24 formation, is a single critical alignment at a 1F size that is not registration sensitive.

Figure 5:
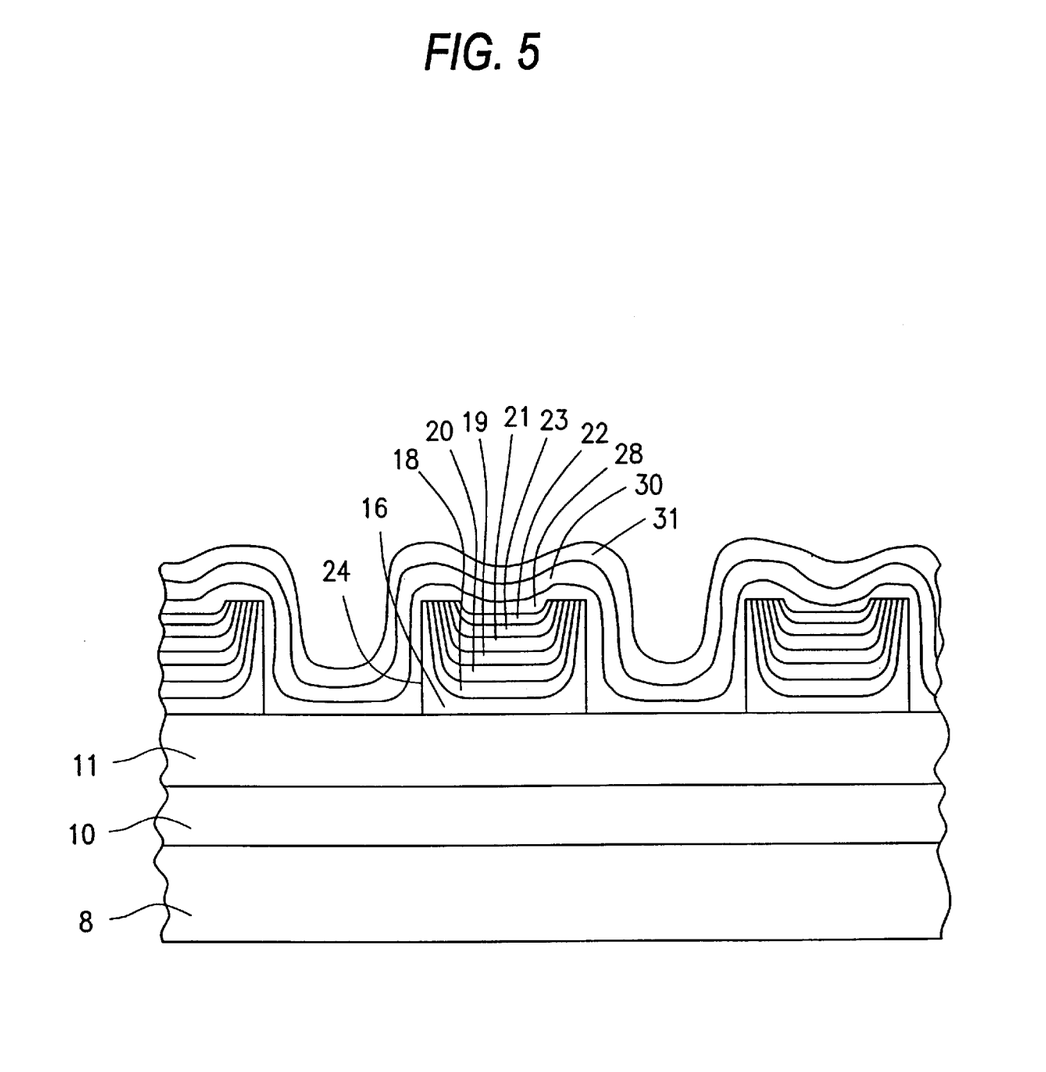
FIG. 5 is an illustration of a stage of processing of the MRAM device according to the invention, subsequent to the stage illustrated in FIG. 4.

Referring to FIG. 5, a non-magnetic layer 28 is next deposited conformally over the layer stacks and the insulating layer 11. This non-magnetic layer 28 can be aluminum oxide ($Al_2O_3$), or another suitable material with equivalent characteristics, and can be formed by depositing an aluminum film over the substrate 10 and layer stacks, and then oxidizing the aluminum film by an oxidation source, such as RF oxygen plasma. This non-magnetic layer 28 should be about 5–25 Å thick. As stated this layer is non-magnetic and serves as tunnel oxide, electron sharing or a barrier layer for the magnetic layers during MRAM operation. The aluminum oxide non-magnetic layer 28 acts as an electron sharing layer when the magnetic orientation of the two magnetic layers is opposite, causing them to attract. Electrons are shared through the valence bands of the non-magnetic, non-conductive layer 28, allowing for electron migration. However, when the magnetic orientation of the two magnetic layers is alike, causing them to repulse, this aluminum oxide layer 28 provides an effective barrier layer preventing electron migration.

Over this non-magnetic layer 28 a second magnetic layer (M2) 30 is conformally deposited. This M2 layer 30 forms the free layer of the MRAM device 32. The M2 layer 30 can be comprised of one or more layers of materials similar to those of the M1 layer 22, preferably NiFe and should also be about 10–100 Å thick. Over the M2 layer 30 is formed a capping and barrier layer 31 to provide oxidation and diffusion barrier protection. This layer 31 can be comprised of tantalum and should be about 20–400 Å thick.

As opposed to the M1 layer 22 (the pinned layer), the M2 layer 30 will not have a fixed magnetization orientation and will be free to shift this orientation, and thus acts as the element for determining the stored value of a memory cell. It is the shifting of the magnetic orientation of the M2 layer 30 that allows the MRAM device to store data as one of two logic levels. This is accomplished by changing the current flow in the sense line of the M2 layer 30 to be in one direction or the opposite direction, thereby causing the related magnetic fields to reverse. Oppositely directed current flows for the M2 30 layer, result in magnetic fields of opposite polarity, which interact with, the pinned magnetic field of the M1 22 layer so that either a "0" or a "1" is read by the sense line as different resistances.

Figure 6:
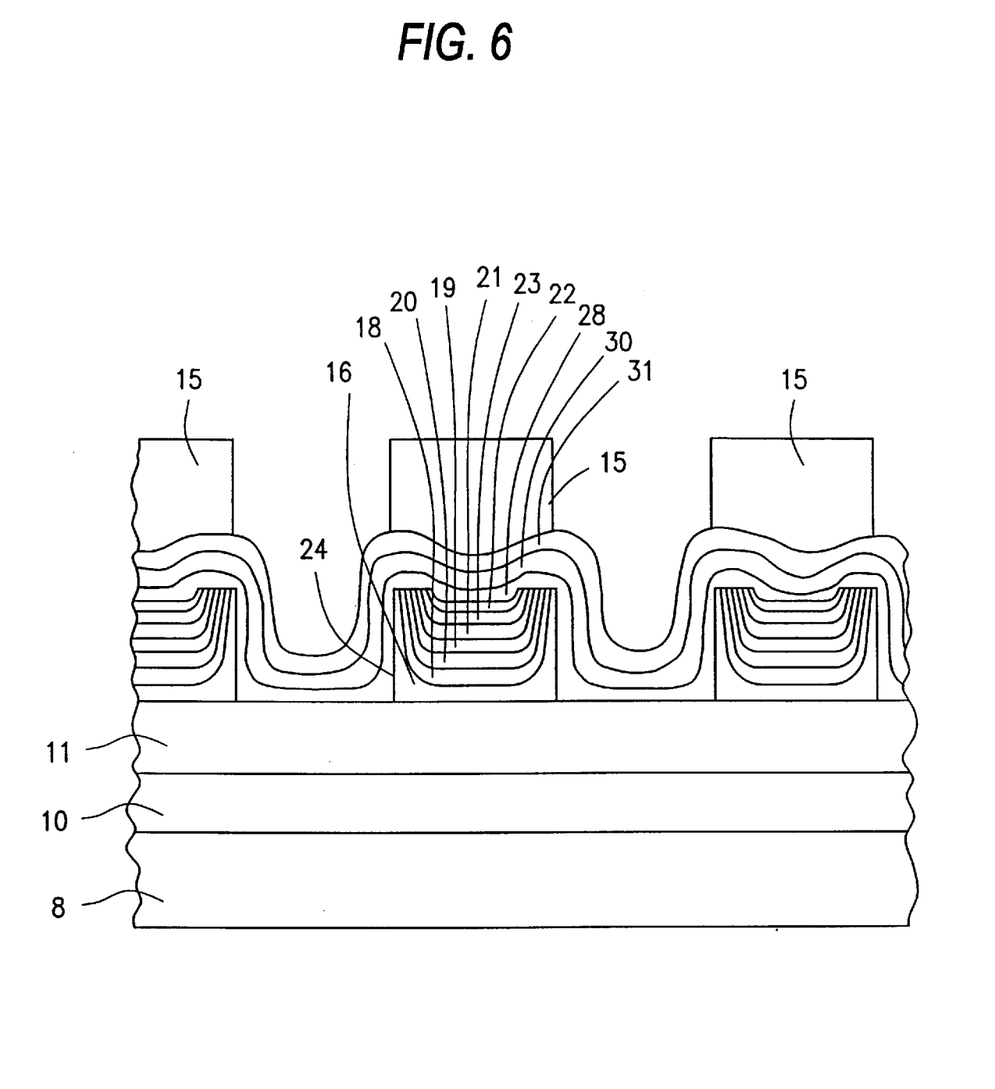
FIG. 6 is an illustration of a stage of processing of the MRAM device according to the invention, subsequent to the stage illustrated in FIG. 5.

Referring to FIG. 6, the MRAM stacks 32 are now patterned over the substrate. This is a self-aligning process. Another photoresist mask 15 is formed and patterned over the capping and barrier layer 31 and the M2 layer 30 and the remaining layers 16, 18, 19, 20, 21, 23, 22 of the bottom portion 38 of the MRAM stack 32. This photoresist mask 15 defines discrete and isolated regions of M2 layer 30 and non-magnetic layer 28 over the M1 layer 22 (capped with layer 31).

Referring to FIG. 7, layer 31, the M2 layer 30 and the non-magnetic layer 28 are next removed to expose the underlying insulating layer 11 and portions of the bottom portion 38 of the MRAM stacks 32. This may be accomplished by selectively etching layer 31, the M2 layer 30 and the aluminum oxide non-magnetic layer 28 over the underlying materials to leave discrete islands 34 of layers 31, 30, and 28 over the rows of the bottom portions 38 of the MRAM stacks 32. Then the photoresist mask 15 is removed and the islands 34 over the MRAM stacks 32 are polished by CMP to form the MRAM stacks 32 shown in FIG. 7.

By the method of the invention, the M2 layer 30 can be accurately controlled in its positioning over and in relation to the M1 layer 22 by the masking and etching steps described in relation to FIG. 6 and FIG. 7. This accurate control improves the electrical characteristics of the MRAM device. Because of the differences in characteristics between the magnetic material and the non-magnetic material and the nitride sidewall 24, the outer edges of the M2 layer 30 can be adjusted to be outside or inside those of the M1 layer 22, without the need for multiple reticles, depending on the desired application. The invention also reduces the lateral direction sensitivity in positioning the M2 layer 30 over the M1 layer 22 because the completed MRAM stack 32, including the already formed underlying structure containing the M1 layer 22 and the now formed M2 layer 30, is defined in a single self-aligning step when the M2 layer 30 and the non-magnetic layer 28 are etched to leave those layers 28, 30 only over the already defined M1 layer 22.

Referring to FIG. 8, after formation of the MRAM stack 32 the M2 layer 30 and the non-magnetic layer 28 (and the capping/barrier layer 31) islands 34 on the top of the MRAM stack 32 are isolated by depositing a layer of dielectric material 40 over the islands 34, the exposed rows of the bottom portion 38 of the MRAM stacks 32, and underlying wafer as shown. The dielectric layer 40 can be TEOS or CVD nitride.

The capping and barrier layer 31 of each island 34 is re-exposed by etching through the dielectric layer 40 to allow for the formation of interconnect lines. The M2 layer 30 of the island 34 is connected (through layer 31) to an upper conductive interconnect line 36, which is the sense line or wordline, formed orthogonal to the underlying bottom portion 38 of the MRAM stack 32. The M2 layer 30 of the island 34 is thereby connected to the M2 layer 30 of other islands 34 over other M1 layers 22 by this upper conductive interconnect line 36. This upper conductive interconnect line 36 is preferably copper and about 2000 Å thick. Next, a dielectric layer (not shown) is blanket deposited over the MRAM stacks 32 and the upper conductive interconnect lines 36. This dielectric layer is polished to form a planarized surface over the upper conductive lines 36 (not shown for illustrative purposes). This dielectric layer can also be TEOS or CVD nitride.

As stated, the bottom portion 38 of each MRAM stack 32, including the nitride layer 16, the tantalum layer 18, the copper layer 20, and the M1 layer 22 run contiguously under the M2 layer islands 34, connecting multiple M2 layer islands 34 in rows orthogonal to the upper conductive interconnect lines 36. AU of the M2 layer islands 34 not connected on the same upper conductive interconnect line 36 or on the same M1 layer 22 are electrically isolated from each other by the dielectric layer 40 deposited over the entire wafer. The underlying bottom portions 38 of each MRAM stack 32 arc also electrically isolated from other MRAM stacks 32 by this dielectric layer 40.

After the formation of the MRAM stacks 32, the M2 layer islands 34, the isolation of the MRAM stacks 32 and the M2 layer islands 34, and the formation of the upper conductive interconnect lines 36, MRAM processing continues as known in the art.

As already discussed, the MRAM devices are connected to controlling transistors. These controlling transistors (not shown) are fabricated within the CMOS layer 11 and can be located in the periphery around the MRAM array. There can be contacts from the copper interconnect lines 20, 36, the digit and sense lines, for the M1 and M2 layers 22, 30; one contact for each copper interconnect. Each contact is connected to at least one controlling transistor in the periphery, which is used to turn the memory devices on or off. These transistors can be formed by standard CMOS processing as known in the art. To conserve wafer space, at least some of the accompanying transistors, such as those for logic and decoding, can be located below the MRAM array.

This invention provides the ability to form MRAM devices as described above with high levels of vertical integration. This can be accomplished by forming a plurality of similar stacks and connects in the vertical direction. The MRAM stacks 32 and connects, as described above in relation to FIGS. 1–8, may be duplicated a plurality of times in the vertical direction, thereby saving valuable wafer space. These additional levels of integration can be formed over the dielectric layer formed over and around the MRAM device upper interconnect lines 36, described above. The second level of integration is formed by the same process described above in relation to FIGS. 1–8 over this dielectric layer.

Figure 9:
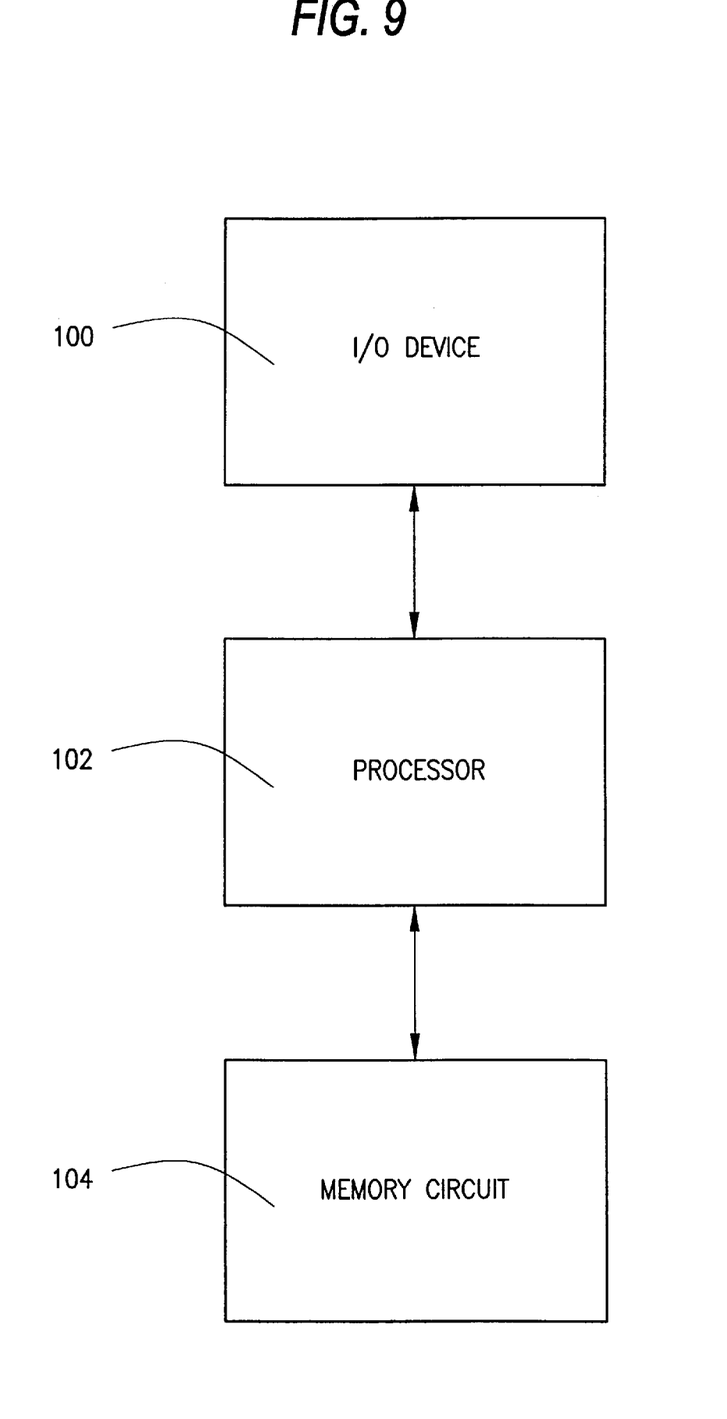
FIG. 9 is an illustration of a processor-based system having a memory circuit and incorporating an MRAM device fabricated in accordance with the invention.

FIG. 9 illustrates a processor system (e.g., a computer system), with which a memory having an MRAM memory device as described above may be used. The processor system comprises a central processing unit (CPU) 102, a memory circuit 104, and an input/output device (I/O) 100. The memory circuit 104 contains an MRAM, and possibly another memory device, including devices constructed in accordance with the present invention. Also, the CPU 102 may itself be an integrated processor, in which both the CPU 102 and the memory circuit 104 may be integrated on a single chip, so as to fully utilize the advantages of the invention. This illustrated processing system architecture is merely exemplary of many different processor system architecture with which the invention can be used.

The above description and accompanying drawings are only illustrative of exemplary embodiments, which can achieve the features and advantages of the present invention. It is not intended that the invention be limited to the embodiments shown and described in detail herein. The invention can be modified to incorporate any number of variations, alterations, substitutions or equivalent arrangements not heretofore described, but which are commensurate with the spirit and scope of the invention. The invention is only limited by the scope of the following claims.

What is claimed as new and desired to be protected by Letters Patent of the United States is:

1. A method of forming an MRAM memory device, comprising:
    forming a freestanding stacked structure above a substrate, said stacked structure comprising nitride sidewalls and a nitride bottom layer interconnecting said sidewalls, a conducting layer within said nitride sidewalls, and a first magnetic layer within said nitride sidewalls and over said conducting layer;
    forming a non-magnetic layer over a region of said stacked structure; and
    forming a second magnetic layer over said non-magnetic layer.

2. The method of claim 1, wherein the act of forming said freestanding stacked structure comprises:
    forming raised oxide layer regions over portions of said substrate, wherein portions of said substrate between said raised oxide layer regions are exposed;
    forming a nitride layer over said raised oxide layer regions and said exposed portions of said substrate;
    forming said conducting layer over said nitride layer;
    forming said first magnetic layer over said conducting layer;
    etching to expose said substrate where under said oxide layer regions to form said freestanding stacked structure, which includes said nitride sidewalls, a remaining bottom nitride layer between said sidewalls, a remaining conductive layer over said remaining bottom nitride layer, and a remaining first magnetic layer over said remaining conductive layer, said first magnetic layer having an upper recessed region; and
    polishing said freestanding stacked structure using said nitride sidewalls as a stop layer.

3. The method of claim 1, wherein act of polishing said freestanding stacked structure does not remove said upper recessed region of said first magnetic layer.

4. The method of claim 1, wherein said act of forming said freestanding stacked structure further comprises:
  forming a first barrier layer within said nitride sidewalls and over said nitride bottom layer, wherein said conducting layer is formed over said first barrier layer;
  forming a second barrier layer within said nitride sidewalls and over said conducting layer;
  forming a seed layer within said nitride sidewalls and over said second barrier layer; and
  forming an anti-ferromagnetic layer within said nitride sidewalls and over said seed layer, wherein said first magnetic layer is formed over said anti-ferromagnetic layer;
  wherein said oxide layer regions, said nitride layer, said first and second barrier layers, said conducting layer, said seed layer, said anti-ferromagnetic layer and said first magnetic layer are etched simultaneously to expose said substrate and form said freestanding stacked structure.

5. The method of claim 4, further comprising polishing said stacked structure using said nitride sidewalls as an etch stop layer.

6. The method of claim 5, wherein said forming of said non-magnetic layer and said second magnetic layer comprise:
  forming said non-magnetic layer over said freestanding stacked structure and said substrate;
  forming said second magnetic layer over said non-magnetic layer;
  removing portions of said second magnetic layer and said non-magnetic layer from over said substrate and said stacked structure, wherein said second magnetic layer and said non-magnetic layer remain over said region of said stacked structure, and wherein said removing of said second magnetic layer and said non-magnetic layer leaves an island of said second magnetic layer and said non-magnetic layer over said stacked structure.

7. The method of claim 6, further comprising:
  forming a third barrier layer over said second magnetic layer, a portion of which is removed simultaneously with said second magnetic layer, wherein said act of removing portions of said third barrier layer, said second magnetic layer and said non-magnetic layer comprises etching.

8. The method of claim 4, wherein said first and second barrier layers comprise tantalum.

9. The method of claim 4, wherein said conducting layer comprises copper.

10. The method of claim 4, wherein said seed layer comprises nickel iron.

11. The method of claim 4, wherein said anti-ferromagnetic layer comprises iron manganese.

12. The method of claim 4, wherein said first magnetic layer comprises nickel iron.

13. The method of claim 6, wherein said non-magnetic layer comprises aluminum oxide.

14. The method of claim 6, wherein said second magnetic layer comprises nickel iron.

15. The method of claim 7, wherein said third barrier layer comprises tantalum.

16. The method of claim 7, further comprising forming a conductive interconnect line over said third barrier layer, said conductive interconnect line being orthogonal to said stacked structure.

17. The method of claim 16, wherein said conductive interconnect line is a wordline and said conducting layer is a bit line.

18. The method of claim 16, further comprising forming a dielectric layer over said conductive interconnect line.

19. A method of forming a semiconductor device, comprising:
  forming a plurality of layers of MRAM cells over a substrate, the forming of at least one of said layers of MRAM cells comprising:
  forming at least one first freestanding stacked structure over a substrate, said at least one first freestanding stacked structure having first nitride sidewalls, a first nitride bottom layer interconnecting said first nitride sidewalls, and the following layers over said first nitride bottom layer and within said nitride sidewalls, a first barrier layer over said first nitride bottom layer, a conducting layer over said first barrier layer, a second barrier layer over said conducting layer, a seed layer over said second barrier layer, an anti-ferromagnetic layer over said seed layer, and a bottom magnetic layer and over said anti-ferromagnetic layer, said bottom magnetic layer having a recessed region;
  forming a first non-magnetic layer over a first region of said bottom magnetic layer of said at least one first freestanding stacked structure and within said recessed region of said bottom magnetic layer;
  forming a first top magnetic layer over said first non-magnetic layer;
  forming a third barrier layer over said first top magnetic layer; and
  forming a first conductive interconnect line over said third barrier layer, wherein said first conductive interconnect line is orthogonal to said at least one first freestanding stacked structure.

20. The method of claim 19, wherein the act of forming said at least one first freestanding stacked structure comprises:
  forming substantially parallel first raised oxide layer regions over portions of a substrate, wherein portions of said substrate between said first raised oxide layer regions are exposed;
  forming a first nitride layer over said first raised oxide layer regions and said exposed portions of said substrate;
  forming said first barrier layer over said first nitride layer;
  forming said conducting layer over said first barrier layer;
  forming said second barrier layer over said conducting layer;
  forming said seed layer over said second barrier layer;
  forming said anti-ferromagnetic layer over said seed layer;
  forming said first bottom magnetic layer over said anti-ferromagnetic layer;
  etching to expose said substrate where under said first oxide layer regions to form said at least one freestanding stacked structure; and
  polishing said at least one freestanding stacked structure using said first nitride sidewalls as a stop layer, so as to leave said recessed region in said first bottom magnetic layer.

21. The method of claim 20, further comprising:
  forming a dielectric layer over said first conductive interconnect line and said substrate; and
  forming at least one second layer of MRAM cells over said dielectric layer.

22. The method of claim 20, wherein said first and second barrier layers comprise tantalum.

23. The method of claim 20, wherein said conducting layer comprises copper.

24. The method of claim 20, wherein said conductive interconnect line comprises copper.

25. The method of claim 20, wherein said seed layer comprises nickel iron.

26. The method of claim 20, wherein said anti-ferromagnetic layer comprises iron manganese.

27. The method of claim 20, wherein said first bottom magnetic layer comprises nickel iron.

28. The method of claim 20, wherein said first non-magnetic layer comprises aluminum oxide.

29. The method of claim 20, wherein said first top magnetic layer comprises nickel iron.

30. The method of claim 20, further comprising:
forming at least one second freestanding stacked structure adjacent to and substantially parallel to said first freestanding stacked structure, wherein said second freestanding stacked structure comprises identical layers as said first freestanding stacked structure, wherein said first conductive interconnect line is over said third barrier layer of each said freestanding stacked structure and connects said first and said second freestanding stacked structures.

31. The method of claim 30, wherein said first conducting layers of said first and second freestanding stacked structures are bit lines and said first conductive interconnect line is a wordline.

32. The method of claim 30, wherein said method is repeated over a dielectric layer formed over said first and second freestanding stacked structures, said conductive interconnect line, and said substrate.

33. A method of forming an MRAM device, comprising:
forming at least two spaced oxide regions over a substrate, said at least two spaced oxide regions having substantially vertical sidewalls and being substantially parallel to one another;
forming a nitride layer over said at least two spaced oxide regions and said substrate, wherein said nitride layer is formed on said substantially vertical sidewalls of said at least two spaced oxide regions;
forming a first barrier layer over said nitride layer;
forming a conducting layer over said first barrier layer;
forming a second barrier layer over said conducting layer;
forming a seed layer over said second barrier layer;
forming an anti-ferromagnetic layer over said seed layer;
forming a bottom magnetic layer over said anti-ferromagnetic layer;
exposing said substrate under said at least two spacer oxide regions by etching, thereby forming nitride sidewails comprising remaining said nitride layer, wherein said sidewalls partially surround said first barrier layer, said conducting layer, said second barrier layer, said seed layer, said anti-ferromagnetic layer, and said bottom magnetic layer;
polishing said bottom magnetic layer, said anti-ferromagnetic layer, said seed layer, said second barrier layer, said conducting layer, said first barrier layer, and said nitride layer, using said nitride sidewalls as a stop layer, so that said bottom magnetic layer maintains a recessed region in an upper portion thereof;
forming a non-magnetic layer over said bottom magnetic layer and said substrate;
forming a top magnetic layer over said non-magnetic layer;
forming a third barrier layer over said top magnetic layer;
etching said non-magnetic layer, said top magnetic layer and said third barrier layer so as to leave islands of said non-magnetic layer, said top magnetic layer, and said third barrier layer over regions of said bottom magnetic layer;
polishing said third barrier layer;
forming a dielectric layer over said third barrier layer and said substrate;
exposing tops of said islands through said dielectric layer; and
forming conductive interconnect lines over said islands, wherein said conductive interconnect lines are orthogonal to said bottom magnetic layer.

34. The method of claim 33, wherein said barrier layers comprise tantalum.

35. The method of claim 33, wherein said conducting layer comprises copper.

36. The method of claim 33, wherein said seed layer comprises nickel iron.

37. The method of claim 33, wherein said anti-ferromagnetic layer comprises iron manganese.

38. The method of claim 33, wherein said bottom magnetic layer comprises nickel iron.

39. The method of claim 33, wherein said non-magnetic layer comprises aluminum oxide.

40. The method of claim 33, wherein said top magnetic layer comprises nickel iron.

41. The method of claim 33, wherein said conductive interconnect lines comprise copper.

42. The method of claim 33, wherein said conductive interconnect lines are wordlines and said conducting layer is a bit line.

43. The method of claim 33, wherein said method is repeated in the vertical direction after forming a dielectric layer over said conductive interconnect lines and polishing said dielectric layer.

44. A method of forming an MRAM structure comprising:
forming a plurality of spaced longitudinally extending sacrificial regions over an insulating layer;
forming a plurality of material layers over said insulating layer and said sacrificial regions, the lowermost one of said material layers being an insulator layer having a U-shape cross section profile between said spaced sacrificial regions, at least one of said material layers being a conductive layer formed over said insulator layer of said material layers, and at least one of said material layers being a magnetic material layer formed over said conductive layer; and
etching to remove said sacrificial regions and said material layers where overlying said sacrificial regions to form a plurality of spaces stacked structures which include portions of said lowermost insulator layer having said U-shape profile, and portions of said conductive and said magnetic material layers formed within said U-shaped profile of said insulator layer.

45. The method of claim 44, further comprising:
forming a non-magnetic layer over said plurality of spaced stacked structures and insulating layer;
forming a second magnetic layer over said non-magnetic layer;
removing portions of said non-magnetic layer and said second magnetic layer by etching, leaving islands of said non-magnetic layer and said second magnetic layer over regions of said magnetic layer of said plurality of spaced stacked structures.

* * * * *